(12) United States Patent
Cuong dac Ta

(10) Patent No.: US 6,504,728 B1
(45) Date of Patent: Jan. 7, 2003

(54) PROTECTIVE DEVICE FOR INSTALLING CPCI MICROPROCESSOR BOARDS

(75) Inventor: Peter Cuong dac Ta, Hayward, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 09/607,427

(22) Filed: Jun. 27, 2000

(51) Int. Cl.[7] .............................. H05K 7/14; H05K 7/18
(52) U.S. Cl. ...................... 361/801; 361/737; 361/759
(58) Field of Search .................................. 361/736, 737, 361/756, 759, 801, 802, 725–730; 439/76.1, 79, 607, 328, 483

(56) References Cited

U.S. PATENT DOCUMENTS

| | | | | |
|---|---|---|---|---|
| 5,689,405 A | * | 11/1997 | Bethurum | 361/737 |
| 5,754,404 A | * | 5/1998 | Biermann et al. | 361/737 |
| 5,957,705 A | * | 9/1999 | David et al. | 439/79 |
| 6,008,994 A | * | 12/1999 | Bates | 361/737 |
| 6,058,018 A | * | 5/2000 | Gerriitis et al. | 361/737 |
| 6,095,868 A | * | 8/2000 | Hyland et al. | 439/630 |
| 6,109,931 A | * | 8/2000 | Yotsutani | 439/76.1 |
| 6,210,224 B1 | * | 4/2001 | Wu | 439/607 |
| 6,210,225 B1 | * | 4/2001 | Cai et al. | 439/607 |

* cited by examiner

*Primary Examiner*—Albert W. Paladini
*Assistant Examiner*—Tuan Dinh
(74) *Attorney, Agent, or Firm*—Sierra Patent Group, Ltd.

(57) ABSTRACT

A Compact Personal Computer Interface (CPCI) microprocessor board installation device is disclosed herein. A preferred aspect comprises an inner surface defined by a top plane, a bottom plane, a back plane, and at least one side plane, where the inner surface has means disposed therein for accepting, aligning, and releasably engaging a CPCI board, with a device according to the present invention, an installer may insert a CPCI board into the present invention, and install the board into a back plane while being assured that the board is protected from both physical and ESD damage. After successfully installing the CPCI board, the installer may then release the present invention from the board, and reuse the present invention on another installation.

6 Claims, 3 Drawing Sheets

PROTECTIVE DEVICE FOR INSTALLING CPCI MICROPROCESSOR BOARDS

BACKGROUND OF THE INVENTION

1. Field of the Invention

The present invention relates to Compact Personal Computer Interface (CPCI) microprocessor boards. In particular, the present invention relates to a protective device for installing CPCI boards.

2. The Prior Art Background

Recent innovations in computer technology have resulted in a new microprocessor device standard, known as the Compact Personal Computer Interface (CPCI) standard. Smaller in footprint than the former PCI standard, CPCI compliant devices promise enhanced performance while utilizing less area.

One application that CPCI devices will be used for is industrial applications. For example, it is contemplated that CPCI devices will be deployed within web servers and test and measurement systems. When so deployed, it is contemplated that CPCI devices will be subjected to regular preventative maintenance inspections and repair. Thus, CPCI devices may be removed and re-installed from a back plane host device frequently.

However, removing and installing a CPCI board poses certain risks. For example, because of the size and density of components on a CPCI board, the components may be very fragile and therefore the installer must take great care not to shear off a component while installing the CPCI board. Furthermore, modem solid state components can be very susceptible to electrostatic discharge (ESD) damage caused by static electricity discharging from the installer's body.

Hence, there is a need for a installation device which will allow an installer to install a CPCI board while protecting the components on the CPCI board from physical damage. Furthermore, there is a need for an installation device which allows an installer to install a CPCI board while protecting the board from ESD damage. Additionally, there is a need to satisfy the foregoing needs with a compact, reusable device.

BRIEF DESCRIPTION OF THE INVENTION

The invention satisfies the above needs. The present invention relates to Compact Personal Computer Interface (CPCI) microprocessor boards. In particular, the present invention relates to a protective device for installing CPCI boards.

A Compact Personal Computer Interface (CPCI) microprocessor board installation device is disclosed herein. A preferred aspect comprises an inner surface defined by a top plane, a bottom plane, a back plane, and at least one side plane, where the inner surface has means disposed therein for accepting, aligning, and releasably engaging a CPCI board.

With a device according to the present invention, an installer may insert a CPCI board into the present invention, and install the board into a back plane while being assured that the board is protected from both physical and ESD damage. After successfully installing the CPCI board, the installer may then release the present invention from the board, and reuse the present invention on another installation.

BRIEF DESCRIPTION OF THE DRAWING FIGURES

DETAILED DESCRIPTION OF PREFERRED EMBODIMENTS

Persons of ordinary skill in the art will realize that the following description of the present invention is illustrative only and not in any way limiting. Other embodiments of the invention will readily suggest themselves to such skilled persons having the benefit of this disclosure.

Similar designations used herein are intended to designate substantially similar matter.

Figure 1:
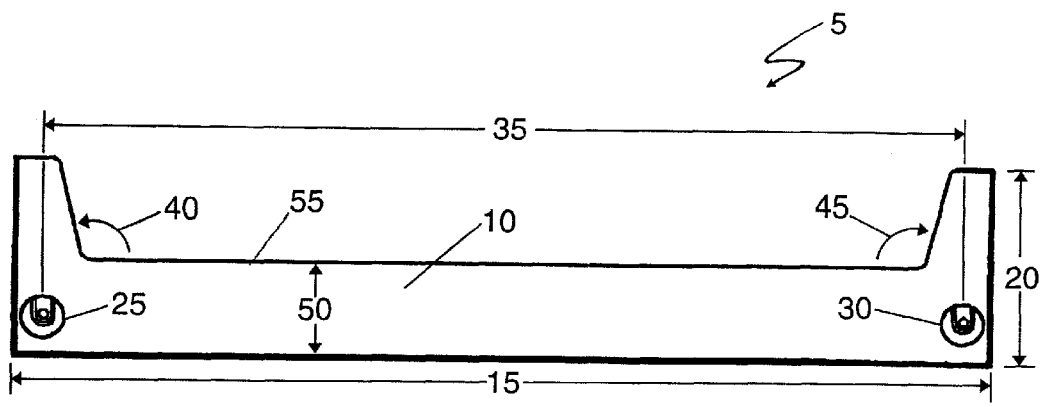
FIG. 1 is a bottom view of a Compact Personal Computer Interface (CPCI) microprocessor board installation device according to the present invention.

FIG. 1 shows a bottom view of a CPCI microprocessor board installation device 5 according to the present invention. The device 5 includes a bottom plane 10 having a length 15 and a width 20. Device 5 should be formed from a non-conductive resilient material to satisfy the ESD needs as noted above. In a presently preferred embodiment of the present invention, device 5 is formed via an injection molding process standard in the art using a plastic such General Electric® C2950 HF or Bayer Bayblend® FR 2010. Additionally, in a presently preferred embodiment of the present invention, device 5 is molded to a thickness of approximately 1.5 to 2 mm.

Length 15 is chosen so as to enable device 5 to encompass a standard CPCI microprocessor board. In a presently preferred embodiment of the present invention, length 15 measures approximately 237 mm and width 20 measures approximately 50 mm.

Bottom plane 10 further may include first and second bottom recesses 25 and 30, respectively. First and second bottom recesses 25 and 30 do not add functionality to the present invention, but are necessary to the injection molding process.

Bottom plane 10 further includes a bottom inner shape 35. Bottom inner shape 35 is defined by a bottom inner width 50 and a pair of angles, first bottom angle 40 and second bottom angles 45. The width of bottom inner width 50 is chosen such that the edge defined by inner shape 55 does not make contact with components on the CPCI board when the board is inserted into the present invention, thus preventing physical damage to components on the board. In a presently preferred embodiment of the present invention, bottom inner width 50 measures approximately 25 mm, and the first and second bottom angles 40 and 45, respectively, each comprise an angle of approximately 105°.

Figure 2:
FIG. 2 is a edge view of a Compact Personal Computer Interface (CPCI) microprocessor board installation device according to the present invention.

Referring now to FIG. 2, a back plane 60 of device 5 is shown. The back plane 60 is formed perpendicular to bottom plane 10 along an edge of bottom plane 10 opposite to the edge defined by bottom inner shape 35.

Figure 3:
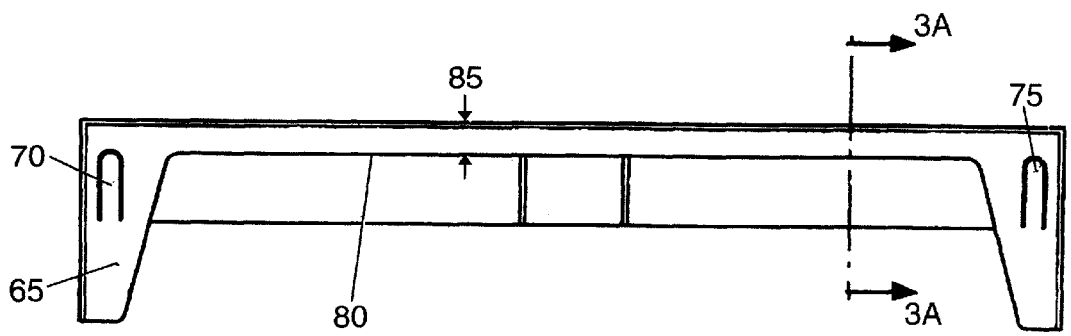
FIG. 3 is a top view of a Compact Personal Computer Interface (CPCI) microprocessor board installation device according to the present invention.

Referring now to FIG. 3, a top plane 65 of device 5 is shown. Top plane 65 is disposed substantially parallel to and over bottom plane 10. Top plane 65 further includes a top inner shape 80. Top inner shape 80 is defined in a manner substantially similar to bottom inner shape 35 of FIG. 1, above. Top inner shape 80 is further defined by a top inner width 85. Top inner width 85 is chosen such that the edge defined by top inner shape 80 does not make contact with components on the CPCI board when the board is inserted into the present invention. In a presently preferred embodiment of the present invention, top inner width 85 measures approximately 8.2 mm.

Referring still to FIG. 3, top plane 65 further includes a first fastener 70 and a second fastener 75 flexibly and resiliently disposed therein. As is appreciated by those of ordinary skill in the art, CPCI boards typically have locator holes disposed therein to enable automated component stuffing machinery to accurately secure and locate the boards within the machine. The present invention takes advantage of these holes by providing first and second fasteners 70 and 75 and configuring the fasteners to releasably engage the holes by forming the fasteners resiliently within top plane 65. Thus, when a CPCI board is inserted into the present invention, first and second fasteners 70 and 75 provide a means for releasably engaging the board prior to the board's installation into a backplane. It is contemplated that the fasteners 70 and 75 will be configured such that after the board has been installed, the user may then release the present invention from the board with a minimum of effort.

It is contemplated the fasteners 70 and 75 will be disposed within top plane 65 in a manner so as to facilitate releasably engaging the locator holes present on a CPCI board. In a presently preferred embodiment of the present invention, first and second fasteners 70 and 75 are disposed proximate to, and parallel with, back plane 60, and are located approximately 222.35 mm apart.

Figure 3A:
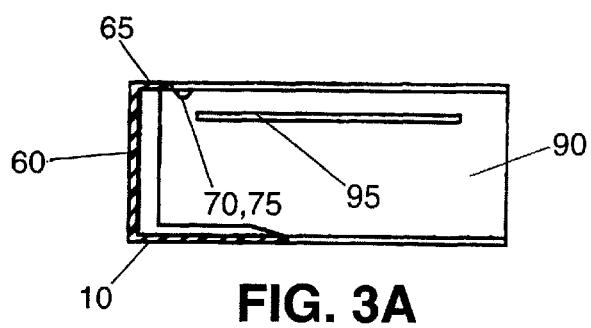
FIG. 3A is a cutaway view of a Compact Personal Computer Interface (CPCI) microprocessor board installation device according to the present invention.

Referring now to FIG. 3A, a section taken through FIG. 3 as indicated is shown. FIG. 3A shows a section taken through bottom plane 10, back plane 60, and top plane 65.

Referring still to FIG. 3A, device 5 further includes at least one side plane 90. Side plane 90 is disposed along the outer edges of top plane 65 and bottom plane 10, and perpendicular to back plane 60. It is contemplated that there will be a side plane 90 on each end of back plane 60.

At least one side plane 90 will include a board guide 95. Board guide 95 is disposed on side plane 95 parallel to top plane 65, and at a distance from top plane 65 suitable to accept a standard CPCI board between the board guide 95 and top plane 65. Side plane 90 is preferably formed to such a height that the present invention may encompass a CPCI board without damaging any components located thereon. In a presently preferred embodiment of the present invention, side plane 90 measures approximately 20 mm in height.

As can be seen by inspection of FIG. 3A, when a CPCI board is inserted between board guide 95 and top plane 65, the board will be guided such that fasteners 70 and 75 will engage the location holes of the CPCI board. Thus, board guide 95 provides a means for aligning a CPCI board within the present invention.

Figure 4:
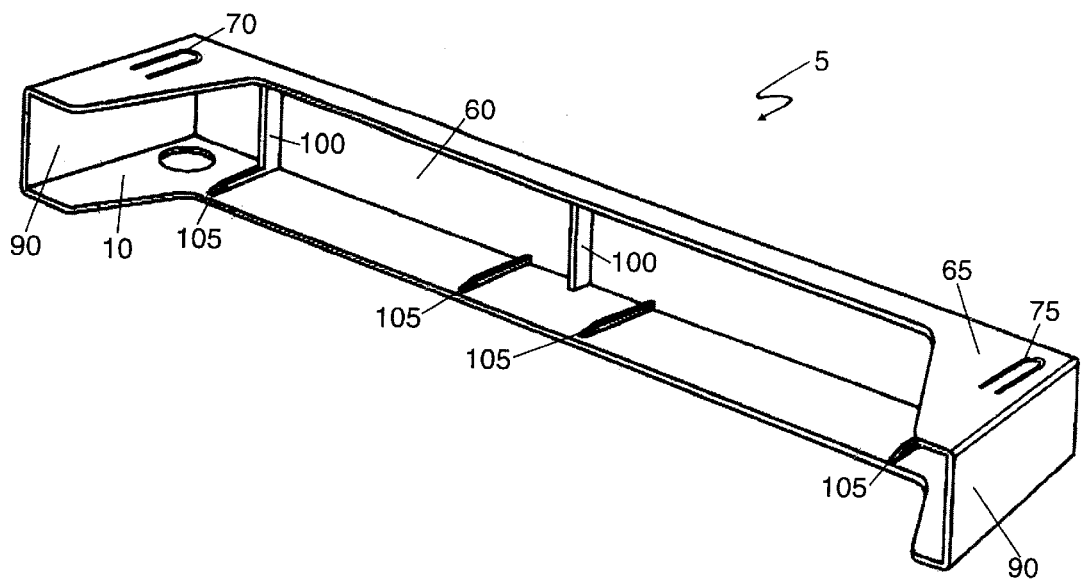
FIG. 4 is a top perspective view of a Compact Personal Computer Interface (CPCI) microprocessor board installation device according to the present invention.

FIG. 4 is a top perspective view of the present invention. FIG. 4 provides an excellent overview of device 5 according to the present invention. FIG. 4 shows top plane 65 and bottom plane 10, together with side planes 90 and back plane 60, forming an inner surface in which means for aligning and releasably engaging a CPCI board are disposed. FIG. 4 further shows first and second fasteners 70 and 75 disposed in top plane 65, each proximate to a corner formed by top plane 65 and side planes 90.

Referring still to FIG. 4, device 5 further includes at least one rib 100. Rib 100 is disposed on, and substantially perpendicular to, back plane 60, and is configured to further align a CPCI board within the present invention. Thus, rib 100 provides a means for aligning a CPCI board within the present invention. Device 5 may further include a plurality of strength members 105, which provide a means for mechanically strengthening the various planes of the present invention.

Figure 5:
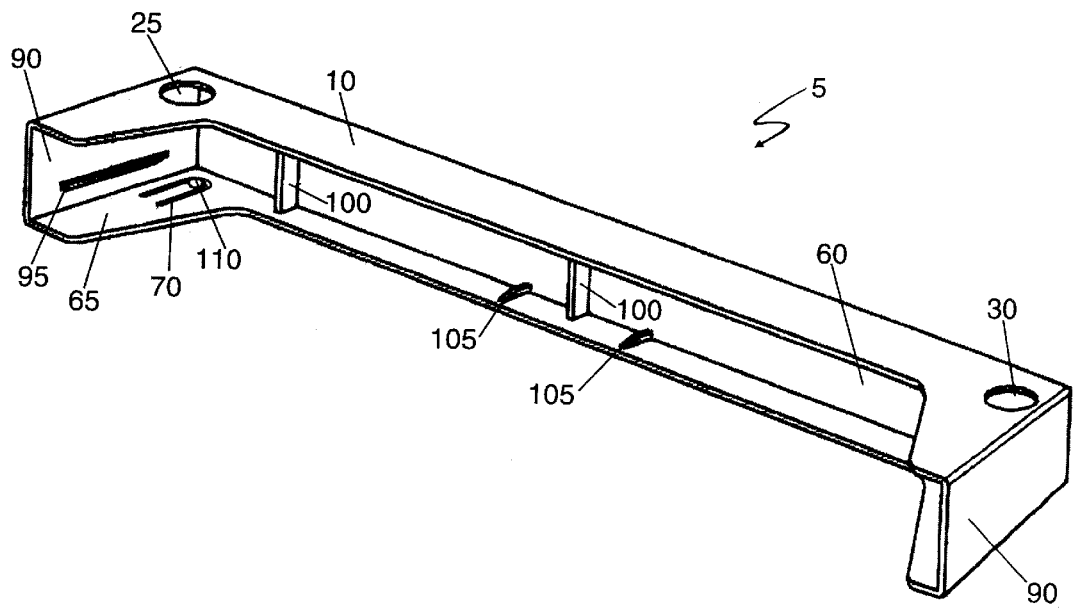
FIG. 5 is a bottom perspective view of a Compact Personal Computer Interface (CPCI) microprocessor board installation device according to the present invention.

FIG. 5 shows a bottom perspective of the present invention. FIG. 5 also provides an excellent overview of device 5 according to the present invention. FIG. 5 shows top plane 65 and bottom plane 10, together with side planes 90 and back plane 60, forming an inner surface in which means for aligning and releasably engaging a CPCI board are disposed.

FIG. 5 further shows fastener 70 disposed in top plane 65 proximate to a corner formed by top plane 65 and side planes 90. FIG. 5 shows that fastener 70 may further include a protrusion 110 configured to engage a CPCI board. Thus, protrusion 110 provides a further means for releasably engaging a CPCI board. FIG. 5 further shows board guide 95 disposed on side plane 90 proximate to top plane 65.

FIG. 5 also shows ribs 100 disposed about back plane 60, and strength members 105 disposed about top plane 65.

Figure 6:
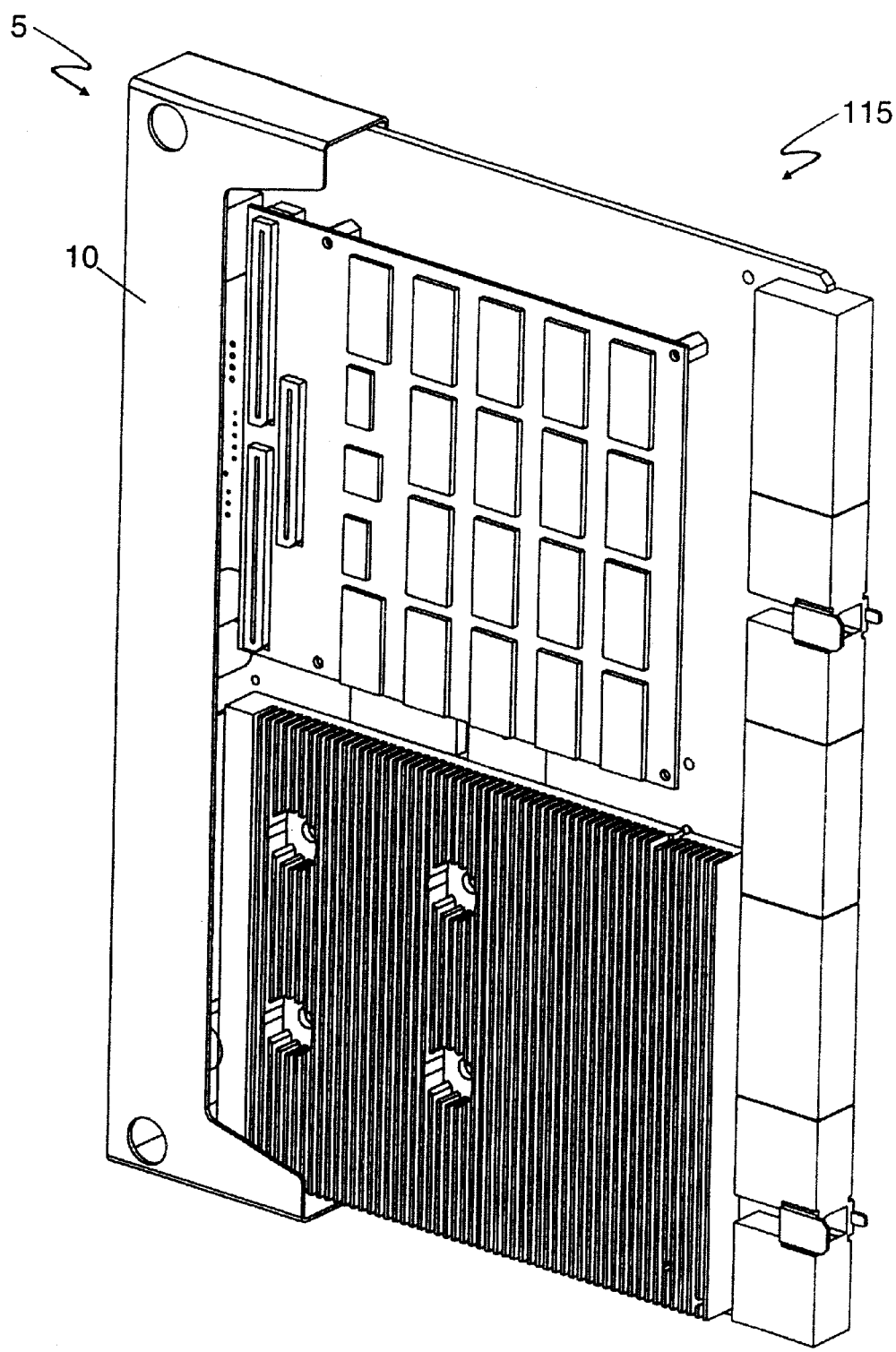
FIG. 6 is a perspective view of a Compact Personal Computer Interface (CPCI) microprocessor board installation device in use according to the present invention.

FIG. 6 is a perspective view of a device 5 in use according to the present invention. FIG. 6 shows a CPCI board 115 inserted and releasably engaged in device 5. As can be seen by inspection of FIG. 6, the present invention is configured such that none of the components on CPCI board 115 are damaged.

Furthermore, as can be seen by inspection of FIG. 6, device 5 is configured using the board guide 95 as disclosed above to provide that device 5 is "keyed" such that the CPCI board may only be inserted one way. This keying feature further ensures that the CPCI board may be inserted without damage. As can be seen by further inspection of FIG. 6, once the board has been releasably engaged in the present invention, the installer may then handle the assembly formed by the present invention and the CPCI board without touching the CPCI board, thus preventing physical and ESD damage.

Thus, as can be seen by inspection of FIG. 6, an installer may insert a CPCI board into the present invention, and install the board into a back plane while being assured that the board is protected from both physical and ESD damage. After successfully installing the CPCI board, the installer may then release the present invention from the board by flexibly twisting the present invention. The present invention may then be re-used for another installation. All of the advantages described herein may be accomplished through the present invention without the need for additional tools.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A Compact Personal Computer Interface (CPCI) microprocessor board installation device comprising:
   a bottom plane;
      said bottom plane having a bottom plane width and a bottom plane length;
      said bottom plane further having a bottom inner shape disposed along one edge of said bottom plane;

a top plane;
  said top plane being formed parallel to said bottom plane;
  said top plane further having a top inner shape disposed along one edge of said top plane;
  said top plane further having at least one fastener disposed resiliently formed therein, said at least one fastener releasably engages a CPCI board;
a back plane;
  said back plane being disposed, perpendicular to, and between, said top and bottom planes, said back plane being located along the edge of said top and bottom planes opposite to said top and bottom inner shapes, respectively;
  said back plane further having at least one rib disposed thereon at least one side plane;
  said at least one side plane being disposed, perpendicular to, and between, said top and bottom planes along an outer edge thereof, and perpendicular to said back plane;
  said at least one side plane having a board guide disposed thereon; and
  said device being configured such that said at least one rib and said board guide are configured to accept and align the CPCI board.

2. The device of claim 1, wherein said device has a length of approximately 237 mm and a width of approximately 50 mm.

3. The device of claim 1, wherein the device is molded from a resilient, non-conductive material.

4. The device of claim 1, wherein said device is keyed such that it may engage a CPCI board in only one fashion.

5. A Compact Personal Computer Interface (CPCI) microprocessor board installation device comprising:
  a bottom plane, said bottom plane having a bottom plane width and a bottom plane length, said bottom plane further having a bottom inner shape disposed a long on e edge of said bottom plane;
  a top plane, said top plane being formed d parallel to said bottom plane, said top plane further having a top inner shape disposed along one edge of said top plane, said top plane further having at least one fastener disposed resiliently formed therein, said at least one fastener including a protrusion configured to releasably engage a CPCI board;
  a back plane, said back plane being disposed, perpendicular to, and between, said top and bottom planes, said back plane being located along the edge of said top and bottom planes opposite to s aid top and bottom inner shapes, respectively, said back plane further having at least one rib disposed thereon;
  at least one side plane, said at least one side plane being disposed, perpendicular to, and between, said top and bottom planes along an outer edge thereof, and perpendicular to said back plane, said at least one side plane having a board guide disposed thereon, and said device being configured such that said at least one rib and said board guide are configured to accept and align the CPCI board, and said device being non-conductive.

6. The device of claim 5 wherein said at least one fastener is configured to releasably engage locator holes of said CPCI board, wherein said at least one fastener is configured to engage said locator holes of said CPCI board prior to the installation of said CPCI board into a backplane and said at least one fastener is configured to disengage said locator holes of said CPCI board after the installation of said CPCI board into a backplane wherein said device is released from the CPCI board.

\* \* \* \* \*